United States Patent [19]

Seidler

[11] Patent Number: 4,597,628

[45] Date of Patent: Jul. 1, 1986

[54] SOLDER BEARING CLIP

[75] Inventor: Jack Seidler, Flushing, N.Y.

[73] Assignee: North American Specialties Corporation, Flushing, N.Y.

[21] Appl. No.: 778,446

[22] Filed: Sep. 19, 1985

Related U.S. Application Data

[63] Continuation-in-part of Ser. No. 567,132, Dec. 30, 1983, which is a continuation-in-part of Ser. No. 402,963, Jul. 29, 1982, abandoned.

[51] Int. Cl.4 .................................. H01R 4/02
[52] U.S. Cl. ......................... 339/275 T; 339/275 R
[58] Field of Search .......... 339/17 LM, 17 M, 275 R, 339/275 T, 276 SF, 275 B

[56] References Cited

U.S. PATENT DOCUMENTS

| 4,203,648 | 5/1980 | Seidler | 339/275 T |
| 4,367,910 | 1/1983 | Seidler | 339/275 B |
| 4,482,197 | 9/1984 | Ouellette et al. | 339/275 B |

Primary Examiner—Z. R. Bilinsky
Assistant Examiner—Paula Austin
Attorney, Agent, or Firm—Darby & Darby

[57] ABSTRACT

A solder-bearing edge clip or connector for attachment to a substrate, where the solder mass is gripped in a thin flat blank of any desired configuration, with the axis of the solder mass extending substantially perpendicular to the plane of the blank.

14 Claims, 15 Drawing Figures

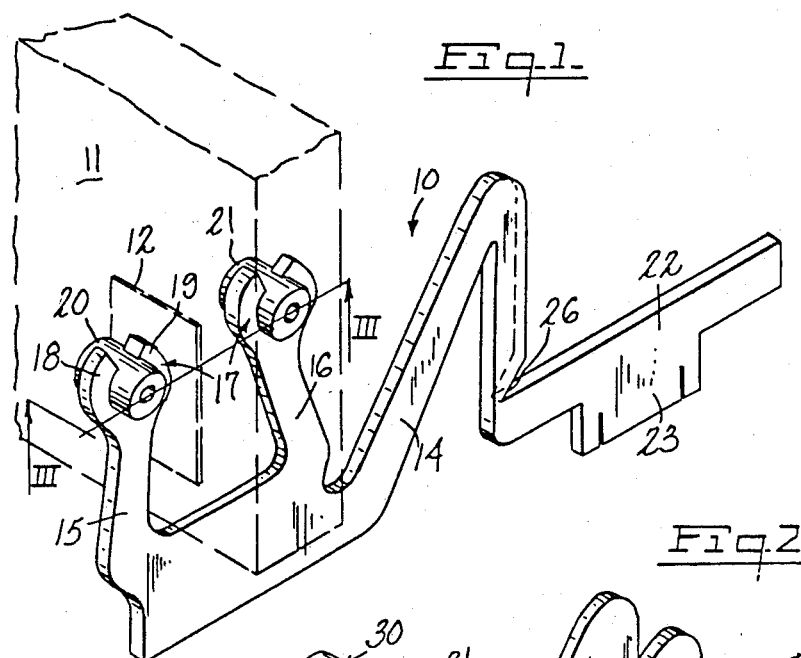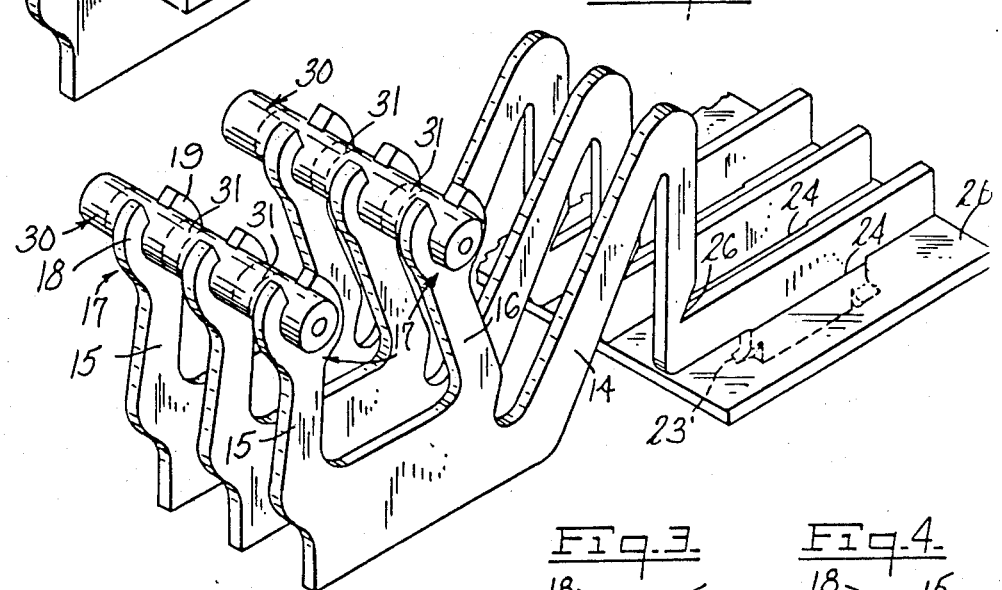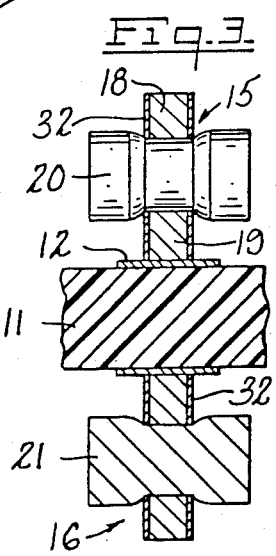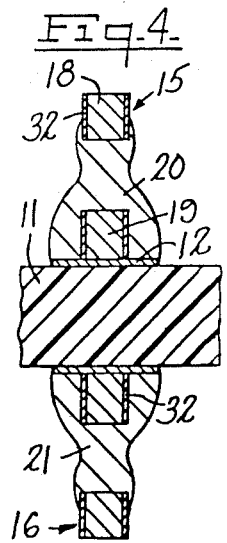

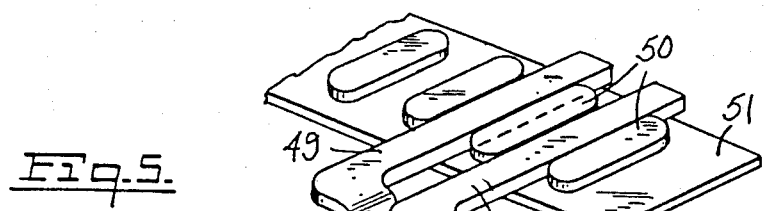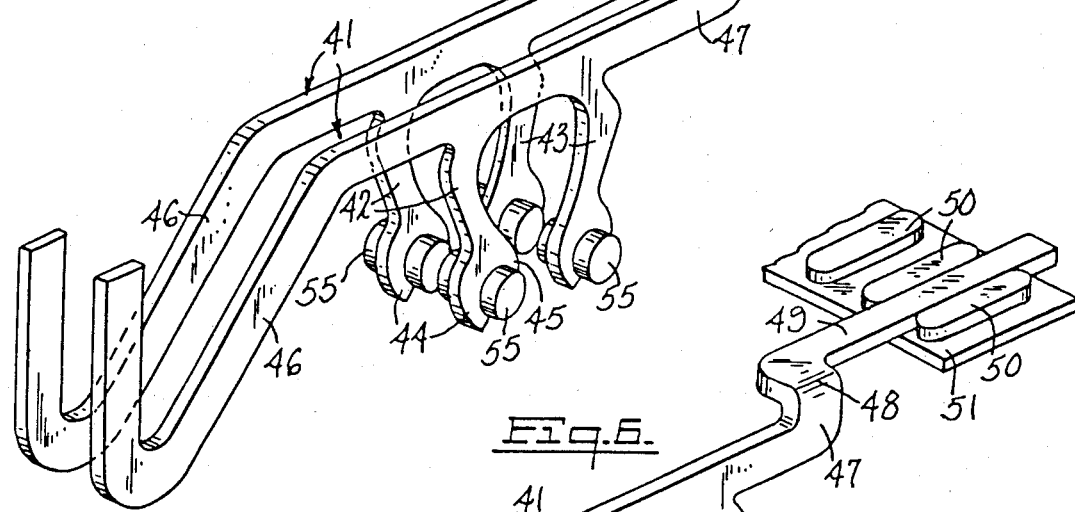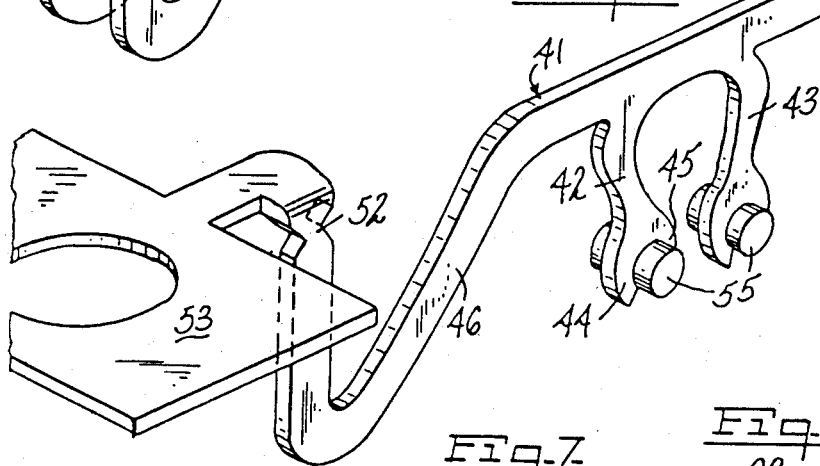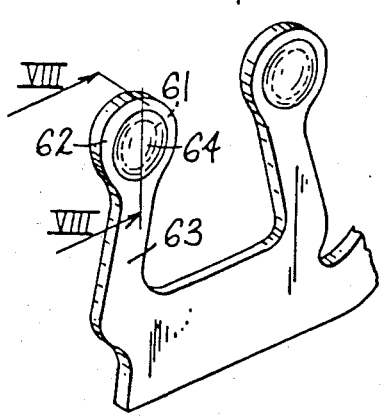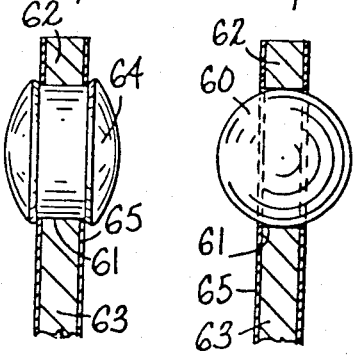

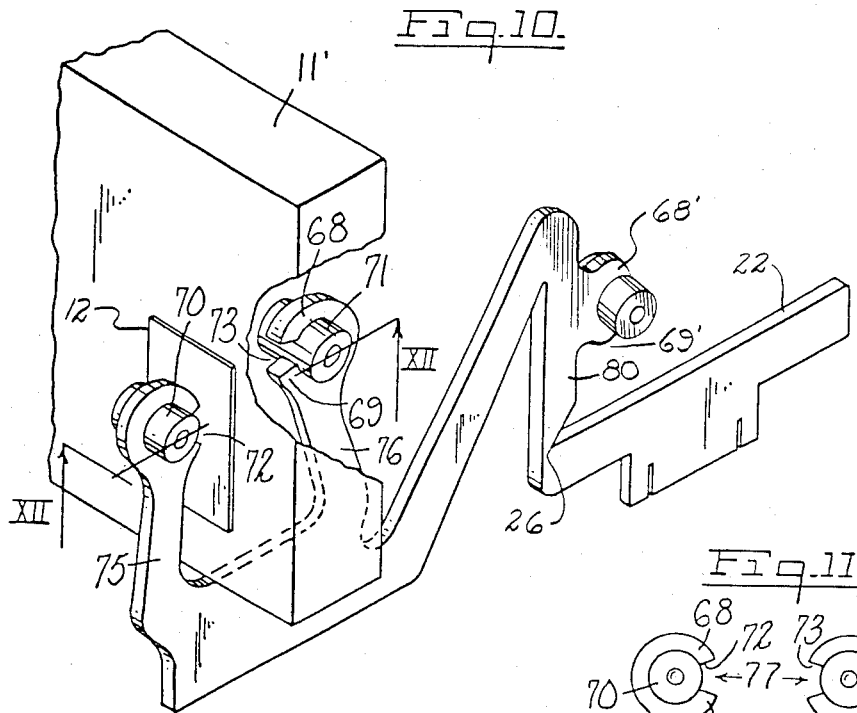
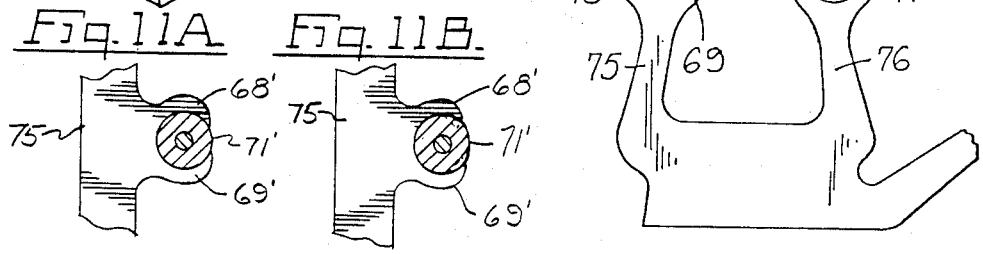
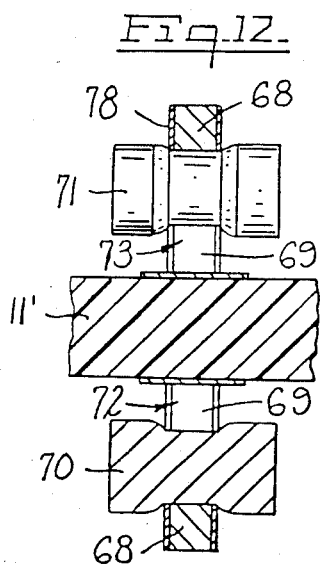
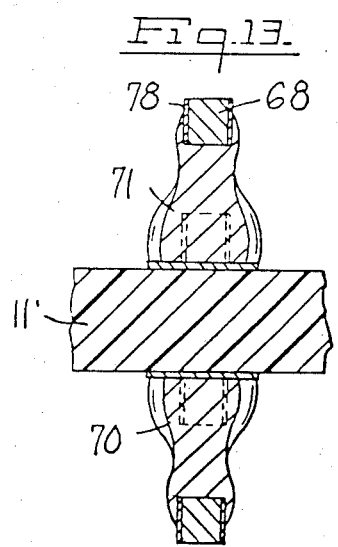

SOLDER BEARING CLIP

This application is a continuation-in-part of application Ser. No. 567,132, filed Dec. 30, 1983 which in turn is a continuation-in-part of application Ser. No. 402,963, filed July 29, 1982, now abandoned.

This invention relates to a solder bearing edge clip or connector for attachment to a contact pad on a substrate, and particularly to such a clip wherein the solder mass is gripped by the edges of fingers formed in a thin flat blank of any desired configuration, the axis of the solder wire being perpendicular to the plane of the blank.

BACKGROUND OF THE INVENTION

In assembling a substrate such as a circuit board or chip on which conductive paths have been formed with connecting elements in the nature of terminal clips, it has been known to provide a small quantity of solder at each point where a terminal clip or connector makes contact with a conductive area ("contact pad") on the substrate, so that a good electrical path may be established upon heating to melt the solder. Several specifically different ways of attaching small solder masses at the appropriate points are disclosed in Seidler U.S. Pat. No. 4,203,648 and patents cited therein. In such prior terminal clips or connectors the means for attaching each solder mass comprises a flat finger of thin metal stamped out of a blank and bent tightly around a section of solder wire, which latter is usually cut to form a small cylindrical slug. A flat surface of the blank, in the area where it is formed as a finger, bears against the solder slug and the solder, upon being melted, must flow initially across a cut edge surface of the blank. The axis of the solder has, customarily, extended parallel to the plane of the flat metal blank.

With the trend toward miniaturization of circular-bearing substrates, it has become important to provide terminal clips and connectors which can be arranged in close lateral proximity to each other and a step in that direction is disclosed in Seidler application Ser. No. 230,907, filed Feb. 2, 1981, now U.S. Pat. No. 4,367,910 where each terminal element is constituted by a finger which by longitudinal folding retains sufficient material to be adequately conductive and self-sustaining while being narrowed.

OBJECTS OF THE INVENTION

It is an object of this invention to provide a solder-bearing edge clip or connector wherein each solder mass is held by oppositely disposed edges of fingers cut or stamped from a flat blank.

It is a further object of the invention to provide an array of such edge clips or connectors which can be attached to contact pads very closely spaced along the margins of a circuit-bearing substrate, the edge clips lying in parallel planes, equally closely spaced.

It is another object of the invention to provide an edge clip wherein the body of the clip is formed by stamping from flat sheet metal and the solder wire, from which each solder mass is formed, has its axis perpendicular to the plane of said sheet metal.

It is still a further object of the invention to provide certain improvements in the form, construction and arrangement of the several parts by which the above named and other objects may effectively be attained.

The invention accordingly comprises an article of manufacture possessing the features, properties, and the relation of elements which will be exemplified in the article hereinafter described, and the scope of the invention will be indicated in the claims.

BRIEF DESCRIPTION OF THE DRAWINGS

Practical embodiments of the invention are shown in the accompanying drawings wherein FIG. 1 represents a perspective view of a single edge clip associated with a substrate portion, shown in broken lines;

FIG. 2 represents a similar view of an array of edge clips mounted on a common bandolier;

FIG. 3 represents a transverse section on the line III—III of FIG. 1;

FIG. 4 represents a similar section showing the solder mass after melting;

FIG. 5 represents a view similar to FIG. 2 showing a first modified form of edge clip and a modified form of bandolier mounting;

FIG. 6 represents a view similar to FIG. 1 showing a second modified form of edge strip connected to a supporting strip at one end and a bandolier at the other end.

FIG. 7 represents a detail perspective view of two clip fingers with solder buttons mounted therein;

FIG. 8 represents a section on the line VIII—VIII of FIG. 7;

FIG. 9 represents the same section as FIG. 8, before "riveting" of the solder mass;

FIG. 10 represents a perspective view, like FIG. 1, showing a further modified form of edge clip associated with a substrate portion, part of which is broken away.

FIG. 11 represents a detail elevation of the finger portion of the edge clip shown in FIG. 10;

FIG. 11A shows a detail of an elevation cross-section of a part of FIG. 11, before soldering;

FIG. 11B shows a similar detail after soldering;

FIG. 12 represents a detail section on the line XII—XII of FIG. 10; and

FIG. 13 represents a view, as in FIG. 12, showing the solder masses after melting.

Referring to the drawings, a first form of clip 10 suitable for connecting to a substrate is shown in FIGS. 1 to 4, FIG. 1 showing the relation of a single clip to an edge portion 11 of a substrate on which a contact pad 12 has been deposited. The contact pad 12 and its counterpart, if any, on the opposite face of the substrate are assumed to be terminals of an electronic circuit (not shown) deposited on the substrate and requiring connection to other circuit elements for any appropriate purpose.

The clip 10 comprises a body portion 14, shown as having a goose-neck configuration, with spaced arms 15, 16 projecting laterally in the plane of the body to provide a gap 17 which approximates the thickness of the substrate. Each arm 15, 16 terminates in a pair of spaced arcuate fingers 18, 19 and, in the completed clip, each pair of fingers embraces tightly a cylindrical solder mass 20, 21. At its opposite end the clip body is connected to a mounting block 22 having a depending tab 23 which can be fitted in a slot 24 of the carrying bandolier 25 and riveted in place, e.g., by upsetting the ends of the tab as shown at 23' in FIG. 2. The connection of the clip body 14 to the block 25 is marked by a break-away notch 26, for easy removal of the bandolier and mounting blocks when a clip or an array of clips has been soldered in place on a substrate.

To manufacture any desired multiplicity of such clips, the blanks (as shown in FIG. 1 but with open fingers and without solder) are stamped from a strip or sheet of metal and are mounted automatically on a carrying bandolier 25 which may be of metal or plastic. Solder wires 30 are laid between the respective fingers which are then closed tightly enough to indent the softer (lead) solder wire, as shown in FIG. 3. The solder wires are then cut away to remove short sections 31 and leave discrete solder masses firmly gripped between each pair of fingers. As an additional refinement, the clip faces are desirably coated with tin 32, at least in the finger areas, in order to provide a compatible path for the solder to follow, when melted, and thus assure formation of a good electrical bond with the pads on the substrate, as illustrated in FIG. 4.

A modified form of clip is shown in FIGS. 5 and 6, wherein the body portion 41 is elongated and extends in opposite directions from the arms 42, 43 with fingers 44, 45 as before. In one direction the body portion is a gooseneck 46 and in the other direction it is a flat strip 47 which is bent 90° at 48 and continues to provide a stem end 49 adapted to be frictionally engaged between the elongated parallel lugs 50 of a carrying bandolier 51 made of metal or plastic. By making the bandolier 51 of plastic, it not only serves to support the clips to permit automatic assembly, but the circuit of the substrate can be electrically tested, after the substrate is inserted and before soldering, by using each clip as a test terminal. Thus defective circuitry can be more readily detected at an earlier stage in production. Because of the elongated form of the clip it is desirable to support also the gooseneck end, as shown in FIG. 6, where a break-away connection 52 is provided between the clip and a carrying strip 53. The solder masses 55 correspond to the masses 20, 21 and are formed and attached in the same manner as described above.

An alternative form of solder mass is shown in FIGS. 7, 8 and 9 as used in clips of the type shown in FIGS. 1 to 6. In this alternative form, the solder wire is replaced by solder spheres 60 which are inserted with a friction fit, in apertures 61 formed in the enlarged end portions 62 of contact arms 63, corresponding to arms 15, 16, 42 and 43. After insertion the spherical masses (FIG. 9) are upset or pressed as shown in FIG. 8 to achieve a two-headed mushroom configuration 64 whereby they are very firmly retained in the clip. The contact arm surfaces may be provided with a tin coating 65, for solder flow assistance as mentioned above.

In the further modified form shown in FIGS. 10 to 13, the lengths of the fingers 68, 69 are unequal so that, when closed around a solder mass 70, 71 (FIG. 10), the gaps 72, 73 between the finger ends are facing each other across the gap 77 wherein a substrate 11' is to be introduced. This offers the advantage that the solder when melted has a shorter path to flow in joining the clip to the contact pad. The contact arms 75, 76 correspond to the arms 15, 16 and support the solder-bearing fingers 68, 69 in position to accommodate the edge of the substrate (e.g., circuit board). The flat surfaces of the contact arms are shown as being provided with tin plating 78, like the coatings 32 and 65, which is very effective in promoting the flow of solder to and into the gaps 72, 73, thus insuring the formation of an excellent electrical flow path between the edge clip and the circuit on the chip or substrate.

FIG. 11A shows an elevation cross-section of a variation 68' of the arm 75 before crimping around the solder mass 70, while FIG. 11B is a similar view after crimping. As seen, the solder projects very slightly from the finger ends, so that when the substrate is inserted, the solder 70 wipes across the contact pad 12 to assure ready contact of the fingers 68' and 69' with the contact pad 12, with the solder therebetween, to improve the soldered joint.

As seen in FIG. 10, a pair of fingers 68" and 69" bearing a solder mass 71" therebetween as in FIG. 11B may be formed integrally with the leg 80 of the contact, so that after breaking away at 26 from the block 22, the contact and its substrate may be surface-mounted on a second substrate, or joined by soldering to another metal surface to join to or support the substrate 11.

In the forms shown in FIGS. 1 to 4 and 10 to 13 the maximum thickness of each clip, before assembly with a circuit chip, is only the length of the solder mass, and this could be reduced by using solder balls as shown in FIGS. 7, 8 and 9. That is, the body of the clip is a flat sheet, in a single plane, which permits assembling the clips with a very close pitch, as/now frequently required or desired. In the modified clip of FIGS. 5 and 6, the overall width is slightly greater due to the bending of the stem end into a different plane but a relatively close pitch can still be attained since the stem itself is straight and narrow.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

What I claim is:

1. An edge clip for securement to a contact pad on a circuit-bearing substrate, comprising a clip body portion of sheet metal and at least one compact mass of solder, the body portion being flat and provided with a pair of integral flat contact arm elements lying in the plane of the body portion and each arm element being provided with a pair of arcuately shaped fingers adapted to engage edgewise a mass of solder.

2. An edge clip according to claim 1 wherein edges of the fingers are indented in the engaged solder mass.

3. An edge clip according to claim 1 wherein the solder mass is substantially cylindrical and has its axis disposed perpendicularly to the plane of the body portion.

4. An edge clip according to claim 1 wherein the contact arm elements project from the clip body portion in positions which define, between each pair of said elements, a gap adapted to receive an edge of a circuit-bearing substrate.

5. An edge clip according to claim 4 wherein each paid of arcuately shaped fingers includes a shorter finger and a longer finger, each shorter finger being located on the side of the respective contact arm element which is closer to the other contact arm element of the same pair.

6. An edge clip according to claim 5 wherein each longer finger extends around the mass of solder through an arc of more than 180°.

7. An array of spaced edge clips for securement to the contact pads on a circuit-bearing substrate, each clip comprising a clip body of sheet metal and a compact mass of solder, each body portion being provided with at least one integral flat element essentially in the plane of said body portion and having a pair of fingers engaging the mass of solder with the axis of the solder mass being substantially perpendicular to the said plane.

8. An array of spaced edge clips according to claim 7 wherein the solder masses are substantially cylindrical and have their axes perpendicular to the planes of the clip bodies.

9. An array of spaced edge clips as in claim 7, further including a bandolier for supporting said clips at one end in substantially parallel and equally spaced arrangement.

10. An array of spaced edge clips as in claim 9. wherein said bandolier is of insulating material, whereby upon assembly of said array with a circuit card having circuit control areas spaced correspondingly to said clips, individual circuits may be electrically tested by using said clips as test terminals.

11. An edge clip for securement to a contact pad on a circuit-bearing substrate, comprising a clip body portion of sheet metal and at least one compact mass of solder, the body portion being flat and provided with at least one integral flat contact arm element lying in the plane of the body portion and said arm element being provided with an opening adapted to engage edgewise a mass of solder.

12. An edge clip as in claim 11 wherein said opening is formed by at least one curved finger substantially coplanar with said body portion plane and adapted to engage a mass of solder edgewise.

13. An edge clip according to claim 11 wherein the integral flat contact arm element is traversed by an opening and the mass of solder is substantially spherical and fitted in said opening.

14. An edge clip according to claim 13 wherein the mass of solder is expanded to engage the margins of said opening.

* * * * *